United States Patent [19]
Wiseman et al.

[11] Patent Number: 4,936,250
[45] Date of Patent: Jun. 26, 1990

[54] SYSTEM FOR COATING PARTICLES EMPLOYING A PNEUMATIC TRANSPORT REACTOR

[75] Inventors: Leonard G. Wiseman, Lively; George P. Tyroler; Gordon E. Cuthbert, both of Sudbury; John W. Gullick, Lively, all of Canada

[73] Assignee: Inco Limited, Toronto, Canada

[21] Appl. No.: 293,983

[22] Filed: Jan. 6, 1989

[30] Foreign Application Priority Data

Jan. 18, 1988 [CA] Canada .................................. 556749

[51] Int. Cl.⁵ ............................................ C23C 16/44
[52] U.S. Cl. ..................................... 118/716; 118/724; 118/725; 427/251
[58] Field of Search ...................... 118/716, 724, 725; 208/106–110; 427/251

[56] References Cited

U.S. PATENT DOCUMENTS 3,605,685 9/1971 West et al. .......................... 118/724

FOREIGN PATENT DOCUMENTS

| 836483 | 3/1970 | Canada . |
| 0082673 | 12/1982 | European Pat. Off. . |
| 82673 | 6/1983 | European Pat. Off. . |
| 83-03294 | 9/1983 | PCT Int'l Appl. . |
| 87-07356 | 12/1987 | PCT Int'l Appl. . |
| 701797 | 1/1954 | United Kingdom . |
| 1531051 | 11/1978 | United Kingdom . |

OTHER PUBLICATIONS

Webster's New Collegiate Dictionary, G. & C. Merriam Co., Springfield, Mass., (1961), p. 398.

Primary Examiner—Richard Bueker
Assistant Examiner—Terry J. Owens
Attorney, Agent, or Firm—Francis J. Mulligan, Jr.; Edward A. Steen

[57] ABSTRACT

A reactor/transporter apparatus for coating particles by thermally decomposing at least one metal carbonyl into selected metal values and carbon monoxide with the metal values depositing on the particles. The reactor/transporter includes an upper end, a lower end and a source of transport fluid including the metal carbonyl. The transport fluid is supplied into the reactor/transporter for coating particles as they travel from the lower to the upper end. A separator is connected to the upper end of the reactor/transporter for separating the particles from the transport fluid. A downcomer is connected to the separator for collecting the particles. A heater heats the particles and a valve regulates the flow of particles into the reactor/transporter from the downcomer. In addition, the reactor/transporter has a purge vessel for removing coated particles.

7 Claims, 1 Drawing Sheet

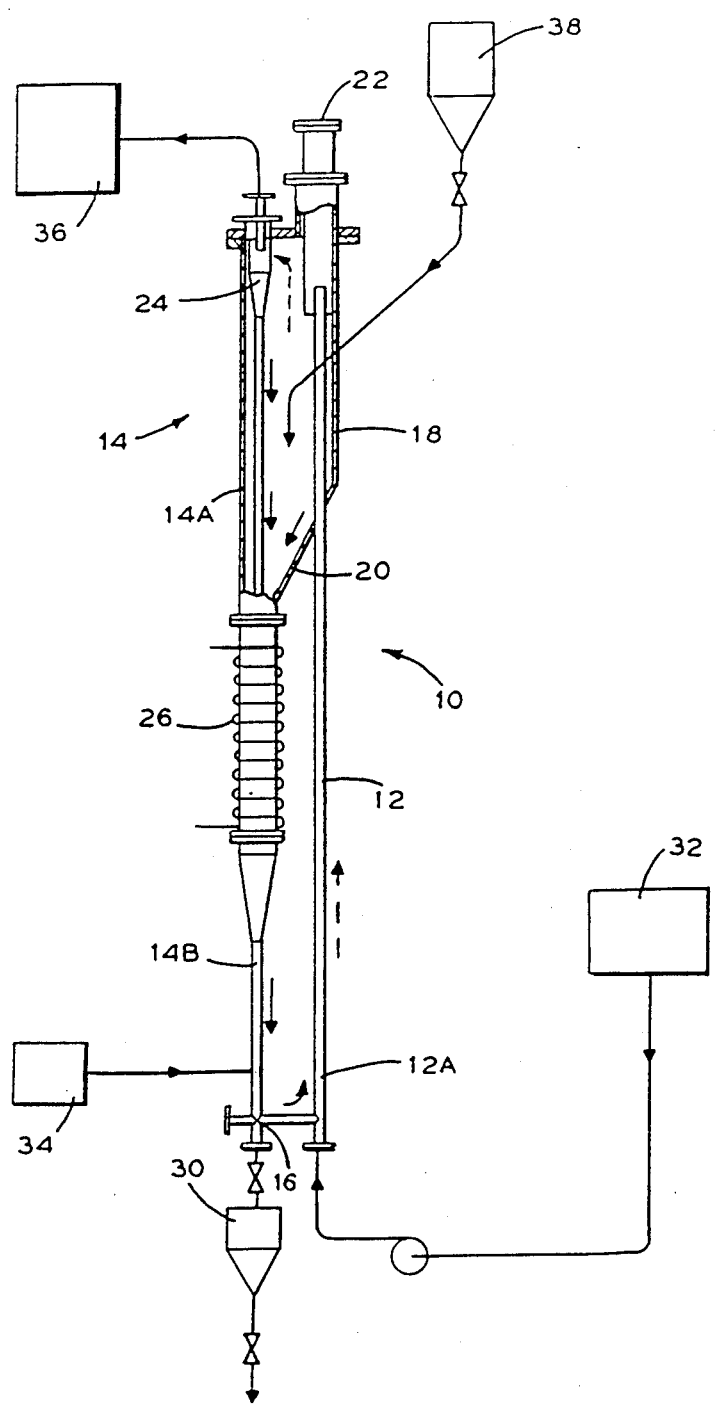

SYSTEM FOR COATING PARTICLES EMPLOYING A PNEUMATIC TRANSPORT REACTOR

TECHNICAL FIELD

The instant invention relates to coating particulate material with metal and, more particularly, to an apparatus system for coating the material by thermal decomposition of metal carbonyl in a pneumatic transport reactor.

BACKGROUND ART

Coating particles by the decomposition of metal carbonyl is currently conducted on a large scale using fluidized bed reactors. See, for example, Canadian Patent No. 836,483.

In short, a gaseous metal carbonyl, frequently nickel tetracarbonyl $Ni(CO)_4$, (and less frequently iron pentacarbonyl $Fe(CO)_5$ or cobalt tetracarbonyl $Co_2(CO)_8$ or tricarbonyl $Co_4(CO)_{12}$) is brought into intimate contact with particulate matter within the fluidized bed. Depending on the conditions including a temperature range of about 149°–316° C., the carbonyl decomposes into nickel metal (Ni) and carbon monoxide (CO) with the nickel metal depositing on the particulate material. Toward the higher temperature range, carbon monoxide tends to disproportionate into carbon dioxide ($CO_2$) and elemental carbon (C) with the carbon thereby contaminating the product. Accordingly, the temperature of the fluidized bed reactor must be monitored.

A further limitation of the fluidized bed reactor is that the size of the particles to be coated are on the order of fifty (50) micrometers and larger. Oftentimes, however, there is a need to coat a particulate substrate having a size of about ten (10) micrometers or less. The fluidized bed reactor is not suitable to coat such small particles. Moreover, by employing a fluidized bed reactor, the decomposition zone and the heating zone occur in one vessel requiring a higher volume and pressure of gas to keep the material moving throughout the fluidized bed reactor and associated system. Heating is accomplished at the bottom and decomposition at the top of the fluid bed at the expense of some metal depositing on the heating surfaces, feed gas nozzles, etc. Complete decomposition to allow recycling of the off-gas for fluidization is a further problem.

SUMMARY OF THE INVENTION

Accordingly, there is provided a pneumatic reactor/transporter in conjunction with associated equipment to cause the thermal decomposition of metal carbonyl with the resultant metal coating the particulate material. Metal carbonyl gas and preheated particles are introduced into the reactor/transporter. The metal pneumatically flowing with the gas deposits on the particles within the reactor/transporter. The entire mass continuously circulates through the essentially closed loop until the desired deposit thickness is achieved. The particles are then removed.

Contrary to the instant invention utilizing a reactor/transporter, the conventional fluidized bed results in a much less uniform gas residence time and less efficient gas/solid contact.

BRIEF DESCRIPTION OF THE DRAWINGS

The Figure is a schematic flow diagram of the invention.

PREFERRED MODE FOR CARRYING OUT THE INVENTION

The Figure depicts an essentially closed loop system 10 for decomposing carbonyl gas into its metallic and non-metallic components for the subsequent metallic coating of particles flowing concurrently therein. The dashed arrows represent combined solid/carbonyl feed gas flow. The solid arrows represent solids.

The system 10 includes a reactor/transporter 12 in the form of a tube, a downcomer 14 and a connecting leg in the form of an L valve 16. The upper portion of the reactor/transporter 12 communicates with a cylindrical enclosure 18 which empties into a hopper 20. For the sake of discussion, the reactor/transporter 12 is subdivided into a lower section 12A. The downcomer 14 is divided into an upper section 14A which encompasses the enclosure 18 and the hopper 20 and a lower section 14B. A target flange 22 is disposed at the end of the reactor/transporter 12.

A cyclone separator 24, located in the enclosure 18, is affixed to the upper section 14A of the downcomer 14. The base of the hopper 20 communicates with a heater 26 with the downcomer 14 extending therethrough.

The lower section 14B of the downcomer 14 is connected to the L valve 16 which communicates with the lower section 12A. A gas source 34 supplies gas to the valve 16. Disposed below the downcomer 14 is purge vessel 30 which acts as a coated particle collector.

During start-up, the system 10 is prepared for operation by charging a suitable quantity of particles through the top of the hopper 20 or through the particle source 38, sealing the system 10 and commencing an initial, warm up solids circulation by supplying an inert gas (usually nitrogen and carbon dioxide) from sources 32 and 34. As the particles fall through the heater 26 they are heated to or maintained at a predetermined temperature. Upon the attainment of the predetermined operating temperature, the source 32 ceases to supply the inert gas and instead supplies a transport gas to initiate the coating reactions.

In operation, the feed or transport gas which includes carbonyl gas (usually nickel and/or iron carbonyl) and possibly augmented by carbon monoxide gas is supplied by source 32. The gas mixture, acting both as the reacting and transporting medium, is delivered at suitable pressure to the lower section 12A of the reactor/transporter 12.

The L valve 16 is essentially a simple one way elbow-type valve in which a control gas is caused to flow into the downcomer 14 in the direction shown by the solid arrows. Although an L valve 16 is depicted, it should be understood that other valves or controls may be utilized, (e.g. a "J" valve). The L valve 16 functions as a simple regulator for the particle flow coming from the heater 26. By varying the quantity and rate of the gas introduced into the downcomer 14B from the source 34, the volume and rate of the particles being fed into the reactor/transporter 12 may be modulated. Preferably the gas from the source 34 is inert and may also function as a purge gas. Other control means may be employed as well.

The temperature of the solid particles is selected to cause the carbonyl gas to thermally decompose into its desired component parts and deposit the metal(s) onto the surface of the upwardly flowing particles. To reduce carbon contamination of the product, it is preferred to utilize temperatures toward the lower range of carbonyl dissociation.

As a result of the design of the loop 10, the reactor/transporter 12 functions both as a transport conduit and a reactor; hence the term "reactor/transporter". The intimate mixing action engendered by the flowing particles being transported by the decomposing carbonyl transport medium ensures efficient and thorough particle coating.

Upon exiting the reactor/transporter 12 in the enclosure 18, the solids are separated from the gas and fall towards the bottom of the hopper 20. Depending on the size of the particles, some particles strike the target flange 22 and are propelled downwardly into the hopper 20. Smaller entrained particles will pass into the cyclone separator 24 wherein they are separated from the gas and routed downwardly towards the hopper 20. The stripped gas may be directed toward a bag house or other unit 36 for additional treatment.

The coated particles flow by gravity through the heater 26 and the lower downcomer section 14B and pass through the L valve 16 for a subsequent return trip through the reactor/transporter 12.

The heater 26 maintains the temperature of the particles within a predetermined range in order to expedite the decomposition of the carbonyl and cause the resultant free metal to coat the particles. The temperature is a function of the carbonyl blend utilized, the type and size of the particles used (which also function as catalytic surfaces) and the presence of any gas in the system 10 supplied by the source 34.

Each particle receives a thin coating of metal on each pass through the reactor/transporter 12. Thus, nickel (for example) granules up to 400 micrometers can be grown from 10–20 micrometers diameter seed particles. Similarly, metal particles can be grown from a different base seed. Continuous production of such granules can be achieved by periodic seeding from the particle source 38 and by the continuous removal of predetermined size particles by drawing systems known to those in the art from the purge vessel 30.

The system 10 alternatively (and as drawn) may be used as a batch system. In any event, assorted materials such as graphite, tungsten, silica, glass, tungsten carbide, silicon carbide, copper, etc. may serve as the particulate matter.

The use of the reactor/transporter 12 engenders high turbulent contact between the particles and coating medium facilitating the uniform coating of very fine particles (4 micrometers) as well as larger particles (40 micrometers and more). The efficient turbulent action ensures good gas/solid contact as the particle laden gas flows upwardly through the reactor/transporter 12. The instant tubular design permits a relatively small reactor vessel and permits the expeditious separation of the heating and reacting zones.

Coatings can be controlled over a wide range, say from 1–90% of the deposited metal on the final product. Flexibility for different particle densities and sizes can be provided by simply supplying the appropriate carbonyl transport gas velocity to convey the particles being coated thus allowing the metal deposition rate to vary with gas velocity. Similarly, the gas-metal ratio and the diameter of the reactor/transporter 12 can be varied to independently adjust the gas velocity and metal deposition rate to suit the size, heat capacity, density and other properties of the material being coated. Sintering or oxidation of the material can be reduced by operating at the minimum temperatures required for carbonyl decomposition. Additional carbon deposition can be controlled by employing an inert purge gas from the source 34 to assist in purging or excluding CO and carbonyl from the downcomer 14 as well as assisting the feeding of the particles through the L valve 16.

Nickel was successfully deposited on four different substrates using a corresponding bench scale version of the instant invention. The operating data are given below:

| Material | Hollow Glass Beads | Iron | W-Ti Carbide | Tungsten |
|---|---|---|---|---|
| Particle Size (micrometers) | 20–100 | 10–40 | 20–50 | 4 |
| Temperatures (°C.) | | | | |
| Solids from Heating Zone | 180–200 | 290 | 240 | — |
| Heating Zone Wall | 380–400 | 350 | 350 | 420 |
| Top of Reactor/Transporter | 120 | 150 | 150 | 180 |
| Flows (l/min) | | | | |
| L Valve Gas | 0.5 | 3.9 | 3.9 | 0.4 |
| Feed (Metal Carbonyl/CO) Gas | 5.5 | 29 | 27 | 16 |
| Ni(CO)$_4$ Concentration in Feed Gas (g Ni/Nm$^3$) | 70 | 20 | 50 | 20 |
| Feed Gas Inlet Velocity* (m/sec) | 0.5 | 2.7 | 2.6 | 1.3 |
| Wt. % Ni Plated | 20 | 2 | 14 | 6 |

*Velocity increases from bottom to top of the reactor/transport tube due to gas and heated solids addition from the L valve, and due to decomposition of carbonyl.

While in accordance with the provisions of the statute, there is illustrated and described herein specific embodiments of the invention, those skilled in the art will understand that changes may be made in the form of the invention covered by the claims and that certain features of the invention may sometimes be used to advantage without a corresponding use of the other features.

The embodiments of the invention in which an exclusive property or privilege is claimed are defined as follows:

1. An apparatus for coating particles by thermally decomposing at least one metal carbonyl into selected metal values and carbon monoxide with the metal values depositing on the particles, the apparatus comprising a tubular reactor/transporter having an upper end, a lower end, and a source of transport fluid including the metal carbonyl for supplying transport fluid into the reactor/transporter for coating particles in the reactor/transporter as the particles travel from the lower to the upper end, means for separating the particles from the transport fluid after the particles have been coated in the reactor/transporter connected to the upper end of the reactor/transporter, a downcomer means connected to the separator means, the downcomer means having a means for collecting the particles and a means for heating the particles, means for regulating the flow of the heated particles into the reactor/transporter from the downcomer means for coating the particles by decomposition of the transport fluid onto the particles, and means for removing the coated particles.

2. The apparatus according to claim 1 including circulating means for propelling the transport fluid and particles upwardly through the reactor/transporter to a separator means.

3. The apparatus according to claim 1 wherein the collecting means includes a hopper disposed below the separating means and above the heater means for gravity feeding the particles to the heater means.

4. The apparatus according to claim 1 wherein the means for regulating the flow of the particles in the reactor/transporter includes a source of a second fluid connected to the downcomer for excluding carbon monoxide and carbonyl from the downcomer.

5. The apparatus according to claim 4 wherein a valve connects the downcomer and the reactor/transporter and communicates with the source of the second fluid and the second fluid is an inert gas.

6. The apparatus according to claim 1 wherein the separating means includes an impact target disposed above the reactor/transporter.

7. The apparatus according to claim 1 including particles between about 4 and about 40 micrometers.

* * * * *